(12) United States Patent
Kitamura et al.

(10) Patent No.: US 7,560,729 B2
(45) Date of Patent: Jul. 14, 2009

(54) ORGANIC ELECTROLUMINESCENT DEVICE FOR IMPROVED LUMINOUS EFFICIENCY AND CHROMATICITY

(75) Inventors: Yoshitaka Kitamura, Kanagawa (JP); Masayuki Mishima, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 298 days.

(21) Appl. No.: 11/389,012

(22) Filed: Mar. 27, 2006

(65) Prior Publication Data

US 2006/0220011 A1    Oct. 5, 2006

(30) Foreign Application Priority Data

Mar. 30, 2005    (JP) .............................. 2005-098747

(51) Int. Cl.
*H01L 35/24*    (2006.01)
*H01L 51/00*    (2006.01)

(52) U.S. Cl. ....................................................... 257/40
(58) Field of Classification Search .................... 257/40
See application file for complete search history.

(56) References Cited

U.S. PATENT DOCUMENTS

| 2001/0053462 | A1* | 12/2001 | Mishima | .............. | 428/690 |
| 2002/0197511 | A1* | 12/2002 | D'Andrade et al. | .......... | 428/690 |
| 2005/0184655 | A1* | 8/2005 | Kitamura | ................... | 313/504 |
| 2006/0057427 | A1* | 3/2006 | Tsukahara et al. | ........... | 428/690 |
| 2006/0105202 | A1* | 5/2006 | Kitamura | ................... | 428/690 |

FOREIGN PATENT DOCUMENTS

| JP | 2001-319780 A | 11/2001 |
| JP | 2004-522276 A | 7/2004 |
| JP | 2004-281087 A | 10/2004 |
| WO | WO-02/091814 A2 | 11/2002 |

OTHER PUBLICATIONS

Machine Translation of JP 2004-281087.*

* cited by examiner

*Primary Examiner*—Jerome Jackson, Jr.
*Assistant Examiner*—Anthony Ho
(74) *Attorney, Agent, or Firm*—Birch, Stewart, Kolasch & Birch, LLP

(57) ABSTRACT

The invention discloses an organic electroluminescent device having an anode, a cathode and a plurality of organic compound layers provided between the anode and the cathode and including a light-emitting layer, wherein the light-emitting layer contains two light-emitting materials including a phosphorescent light-emitting material, and a host material; and when three or more organic compound layers are provided between the light-emitting layer and the anode, and when the ionization potential of the light-emitting layer is $Ip1$ and the ionization potentials of the three or more organic compound layers are $Ip2, Ip3, \ldots$, and $Ipn$ in the order starting from the light-emitting layer, the formula (1): $Ip1 > Ip2 > Ip3 > \ldots > Ipn$ ($n$ is an integer of 4 or more) is satisfied, or when three or more organic compound layers are provided between the light-emitting layer and the cathode, and when the electron affinity of the light-emitting layer is $Ea1$ and the electron affinities of the three or more organic compound layers are $Ea2, Ea3, \ldots$, and $Eam$ in the order starting from the light-emitting layer, the formula (2): $Ea1 < Ea2 < Ea3 \ldots < Eam$ ($m$ is an integer of 4 or more) is satisfied.

22 Claims, No Drawings

ORGANIC ELECTROLUMINESCENT DEVICE FOR IMPROVED LUMINOUS EFFICIENCY AND CHROMATICITY

CROSS-REFERENCE TO RELATED APPLICATION

This application claims priority under 35 USC 119 from Japanese Patent Application No. 2005-098747, the disclosure of which is incorporated by reference herein.

BACKGROUND OF THE INVENTION

1. Field of the Invention

The present invention relates to an organic electroluminescent device (light-emitting device or EL device) capable of converting electrical energy into light and emitting light.

2. Description of the Related Art

Nowadays, research into various display devices is active, among which organic electroluminescent (EL) devices are attracting attention as promising display devices that achieve high brilliance of emitted light at a low voltage.

Generally, organic EL devices have a configuration having opposing electrodes (i.e., anode and cathode), and, between the opposing electrodes, a light-emitting layer or a plurality of organic layers containing the light-emitting layer. In the organic EL devices, electrons injected from the cathode and electron holes injected from the anode are recombined in the light-emitting layer, and the resultant excitons emit light, or energy from the excitons migrates to other molecules to generate excitons, which emit light.

However, further improvements in luminous efficiency and improved brilliance have been strongly demanded with a view to energy-saving or improved durability.

It is conceivable that organic EL devices can be used, for example, as a white light source since organic EL devices are individually-luminescing surface light sources. An ideal light source for white light, as defined by the Commission Internationale de l'Eclairage (CIE), has coordinates of (0.33, 0.33) on the CIE Chromaticity Diagram. It is possible to achieve the emission of white light from the luminescence of blue, green, and red light-emitting materials, or from the luminescence of materials which emit rays of two complementary colors.

For a device emitting white light, the emission of white light at low voltage with high brilliance and chromaticity is desired. The use of phosphorescent materials having a luminous efficiency that is higher than fluorescent materials is desired for reduced voltage and higher brilliance (for example, see Japanese Patent Application Laid-Open (JP-A) Nos. 2001-319780, 2004-281087 and 2004-522276). In particular, the development of a phosphorescent material of blue luminescence and the development of a device for making the blue-luminescence phosphorescent material emit light effectively has been desired for improvement in luminous efficiency of light-emitting devices. The reason for this is that, if the luminescent intensity of the blue color is low, it becomes necessary to reduce and adjust the phosphorescent luminescent intensities of the green color and the red color, which are known to be emitted with high efficiency, in order to achieve a desired chromaticity, resulting in reductions in the luminous efficiency of these light-emitting devices.

Further, when the transmission of energy (blue color→green color→red color) between the light-emitting materials occurs in a white light-emitting device, chromaticity deteriorates, and therefore improvement has been desired. A white light-emitting device containing a phosphorescent light-emitting material in each of the blue, green and red light-emitting layers has been disclosed in JP-A No. 2004-522276. However, the luminous efficiency and chromaticity are still inadequate, and further improvement has been desired.

Therefore, there is a need for an organic electroluminescent device having excellent luminous efficiency and chromaticity.

SUMMARY OF THE INVENTION

The invention has been made in view of the above circumstances.

A first aspect of the invention provides an organic electroluminescent device having an anode, a cathode, and a plurality of organic compound layers provided between the anode and the cathode and including a light-emitting layer, wherein the light-emitting layer contains two light-emitting materials including a phosphorescent light-emitting material, and a host material; and when three or more organic compound layers are provided between the light-emitting layer and the anode, and when the ionization potential of the light-emitting layer is Ip1 and the ionization potentials of the three or more organic compound layers are Ip2, Ip3, ..., and Ipn in the order starting from the light-emitting layer, the formula (1): Ip1>Ip2>Ip3> ... >Ipn (n is an integer of 4 or more) is satisfied, or when three or more organic compound layers are provided between the light-emitting layer and the cathode, and when the electron affinity of the light-emitting layer is Ea1 and the electron affinities of the three or more organic compound layers are Ea2, Ea3, ..., and Eam in the order starting from the light-emitting layer, the formula (2): Ea1<Ea2<Ea3 ... <Eam (m is an integer of 4 or more) is satisfied.

A second aspect of the invention provides an organic electroluminescent device having an anode, a cathode, and a plurality of organic compound layers provided between the anode and the cathode and including a light-emitting layer, wherein the light-emitting layer contains two light-emitting materials including a phosphorescent light-emitting material, and a host material; three or more organic compound layers are provided between the light-emitting layer and the anode; three or more organic compound layers are provided between the light-emitting layer and the cathode, and when the ionization potential of the light-emitting layer is Ip1 and the ionization potentials of the three or more organic compound layers provided between the light-emitting layer and the anode are Ip2, Ip3, ..., and Ipn in the order starting from the light-emitting layer, the formula (1): Ip1>Ip2>Ip3> ... >Ipn (n is an integer of 4 or more) is satisfied, and when the electron affinity of the light-emitting layer is Ea1 and the electron affinities of the three or more organic compound layers provided between the light-emitting layer and the cathode are Ea2, Ea3, ..., and Eam in the order starting from the light-emitting layer, the formula (2): Ea1<Ea2<Ea3 ... <Eam (m is an integer of 4 or more) is satisfied.

DETAILED DESCRIPTION OF THE INVENTION

Hereinafter, the invention will be described in detail.

The organic electroluminescent device of the invention has an anode, a cathode, and a plurality of organic compound layers provided between the anode and the cathode and including a light-emitting layer. The light-emitting layer contains a host material, and two light-emitting materials including a phosphorescent light-emitting material. The light-emitting layer may contain three or more light-emitting materials and may contain two or more phosphorescent light-emitting materials. In addition, the organic electroluminescent device may have other light-emitting layer(s). The organic electroluminescent device may have three or more organic compound layers between the light-emitting layer and the anode. In this case, given the ionization potential of the light-emitting layer is $Ip1$ and the ionization potentials of the three or more organic compound layers are $Ip2, Ip3, \ldots$, and $Ipn$ in the order starting from the light-emitting layer, the organic electroluminescent device satisfies the formula (1): $Ip1>Ip2>Ip3> \ldots >Ipn$ (n is an integer of 4 or more). The organic electroluminescent device may have three or more organic compound layers between the light-emitting layer and the cathode. In this case, given the electron affinity of the light-emitting layer is $Ea1$ and the electron affinities of the organic compound layers of three or more are set to $Ea2, Ea3, \ldots$, and $Eam$ in the order starting from the light-emitting layer, the organic electroluminescent device satisfies the formula (2): $Ea1<Ea2<Ea3 \ldots <Eam$ (m is an integer of 4 or more).

Since the organic electroluminescent (EL) device has such a configuration, it has high luminous efficiency and excellent chromaticity.

The organic electroluminescent device of the invention needs to have three or more organic compound layers between the light-emitting layer and the anode (anode side) and/or between the light-emitting layer and the cathode (cathode side).

Such a configuration can reduce the height of the potential barrier between adjacent layers, and can enhance luminous efficiency and luminous brilliance.

It is preferable that the organic electroluminescent device of the invention has the three or more organic compound layers provided between the light-emitting layer and each of the two electrodes. It is more preferable that the three or more organic compound layers are adjacent to the light-emitting layer and either of the two electrodes.

The height of the barrier between adjacent layers is preferably 0.5 eV or less, more preferably 0.4 eV or less, and still more preferably 0.3 eV or less in view of easy movement of charges.

Herein, the ionization potential of each of the layers in the organic electroluminescent device of the invention means the ionization potential of a material which has the smallest ionization potential of the materials contained in the layer in a content of 10 mass % or more. The ionization potential in the specification is measured with a device, AC-1 manufactured by Riken Keiki Co., Ltd., at room temperature in air. The measurement principle of the AC-1 device is described in *Data Collection of Work Function of Organic Thin Film* written by Chihaya Adachi et. al, and published by CMC Publishing Co., Ltd. in 2004.

The electron affinity of each of the layers in the organic electroluminescent device of the invention means the electron affinity of a material which has the largest electron affinity of the materials contained in the layer in a content of 10 mass % or more. The electron affinity can be obtained as follows. The ultraviolet and visible ray absorption spectrum of a film used for measuring the ionization potential is measured, and excitation energy is obtained from energy at the long wavelength end of the absorption spectrum. The electron affinity is calculated from the values of the excitation energy and the ionization potential. Herein, the ultraviolet and visible ray absorption spectrum is measured with a UV3100-type spectrophotometer manufactured by Shimadzu Corporation.

The number (n−1) of organic compound layers provided between the light-emitting layer and the anode in the organic electroluminescent device of the invention is preferably three to five from the viewpoints of reductions in the height of the potential barrier between the layers and manufacture cost, and more preferably three or four.

The number (m−1) of the organic compound layers provided between the light-emitting layer and the cathode is preferably three to five from the viewpoints of reductions in the height of the potential barrier between the layers and manufacture cost, and more preferably three or four.

The number of the organic compound layers provided between the light-emitting layer and the anode may be the same as or different from the number of the organic compound layers provided between the light-emitting layer and the cathode.

When the organic electroluminescent device of the invention has only one. light-emitting layer, the ionization potential ($Ip1$) of the light-emitting layer is preferably 6.4 eV or less, more preferably 6.3 eV or less, and still more preferably 6.2 eV or less. The electron affinity ($Ea1$) of the light-emitting layer is preferably 2.1 eV or more, more preferably 2.2 eV or more, and still more preferably 2.3 eV or more.

The ionization potential ($Ip2$) of the organic compound layer adjacent to the anode side surface of the light-emitting layer is preferably 6.2 to 5.3 eV, more preferably 6.1 to 5.4 eV, and still more preferably 6.0 to 5.5 eV.

Each of the ionization potentials ($Ip3, 4, \ldots, n$) of the other organic compound layers provided between the light-emitting layer and the anode is preferably 5.8 eV or less, more preferably 5.7 eV or less, and still more preferably 5.6 eV or less.

The electron affinity ($Ea2$) of the organic compound layer adjacent to the cathode side surface of the light-emitting layer is preferably 2.2 to 3.1 eV, more preferably 2.3 to 3.0 eV, and still more preferably 2.4 to 2.9 eV.

Each of the electron affinities ($Ea3, 4, \ldots, m$) of the other organic compound layers (electron transport layers) provided between the light-emitting layer and the cathode is preferably 2.6 eV or more, more preferably 2.7 eV or more, and still more preferably 2.8 eV or more.

The ionization potential or electron affinity in the invention is adjusted by selecting at least one material having an ionization potential or an electron affinity within the above-described range as at least one of the materials of each layer.

At least two of at least two light-emitting materials contained in the same light-emitting layer preferably emit light, when a voltage is applied to an electric circuit including the anode and the cathode.

This enables production of light-emitting devices which emit light of various hues.

Herein, whether each of the light-emitting materials emits light or not is checked as follows. First, a layer of each of the light-emitting materials is formed on a glass substrate. The resultant is irradiated with ultraviolet rays, and the emission spectrum is obtained, and the wavelength at the maximum value in the emission spectrum of each material is obtained. Then, a voltage is applied to the device of the invention, and the emission spectrum is obtained. When the intensity at the above wavelength in the emission spectrum of the device is $1/10$ or more of the maximum value in the emission spectrum of the device of the invention, the light-emitting material is regarded as emitting light.

Further, it is preferable that the at least two light-emitting materials includes at least one blue light-emitting material. It is more preferable that the blue light-emitting material is a blue phosphorescent light-emitting material.

Such a configuration enables the organic electroluminescent device of the invention to emit white light, and can extend the application range, for example, illuminations and backlights for liquid crystal.

The types of the substrate, the anode and the cathode which can be used in the invention are not particularly limited, and the substrate, the anode and the cathode can be appropriately selected from known ones. However, at least one of the electrodes (i.e., the anode and the cathode) is preferably transparent, considering the requirements for the light-emitting device.

The organic electroluminescent device of the invention preferably has a structure which includes an anode, at least one hole transport layer, at least one light-emitting layer, at least one electron transport layer and a cathode in this order. Further, the organic electroluminescent device may have at least one charge block layer between the at least one hole transport layer and the at least one light-emitting layer, and/or between the at least one light-emitting layer and the at least one electron transport layer. In addition, the organic electroluminescent device can have at least one hole-injecting layer between the anode and the at least one hole transport layer, and/or at least one electron-injecting layer between the cathode and the at least one electron transport layer.

The light-emitting layer has a function of receiving holes from the anode, the hole-injecting layer or the hole transport layer, receiving electrons from the cathode, the electron-injecting layer or the electron transport layer, and providing a site where the holes and the electrons are recombined to cause light emission at the time that an electric field is applied to the device.

The light-emitting layer in the invention may include one or more host materials. When the light-emitting layer includes two or more host materials, these host materials include, for example, at least one electron-transporting host material and at least one hole-transporting host material. Alternatively, the light-emitting layer may contain at least one host material which has no charge-transporting property and which does not emit light in addition to at least one charge-transporting host material.

The type of the host material is not particularly limited, and the host material can be appropriately selected from known ones. For example, the electron-transporting host material and the hole-transporting host material may be any of materials containable in the electron transport layer and/or the electron-injecting layer, and any of materials containable in the hole transport layer and/or the hole-injecting layer, respectively.

The organic electroluminescent device of the invention contains at least one host material and at least two light-emitting materials including at least one phosphorescent light-emitting material in the same light-emitting layer.

The type of the phosphorescent light-emitting material is not particularly limited, and the phosphorescent light-emitting material can be appropriately selected from the known materials. Examples thereof include those described in JP-A No. 2004-221068, paragraph Nos. 0051 to 0057. Above all, the phosphorescent material is preferably an ortho-metallized metal complex and/or a porphyrin metal complex.

An ortho-metallized metal complex is the generic name of compounds described in for example, *Yukikinzokukagaku-kiso to ohyo*—(Organometal chemistry—Basic and Application—), pages 150 and 232, written by Akio Yamamoto, and published by Shokabo Publishing Co. in 1982, and *Photochemistry and Photophisics of Coodination Compounds*, pages 71 to 77, and 135 to 146, written by H. Yersin, and published by Springer-Verlag in 1987. It is advantageous to use the ortho-metallized metal complex as the light-emitting material in the light-emitting layer in view of high brilliance and excellent luminous efficiency.

Although various ligands can be used as the ligand(s) of the ortho-metallized metal complex and examples thereof are described in the above references, each ligand is preferably a 2-phenylpyridine derivative, a 7,8-benzoquinolin derivative, a 2-(2-thienyl)pyridine derivative, a 2-(1-naphthyl)pyridine derivative or a 2-phenylquinolin derivative. These derivatives may have at least one substituent, if necessary. The ortho-metallized metal complex may have other ligand(s) in addition to the above ligand(s).

The ortho-metallized metal complex in the invention can be synthesized by any of known techniques described in Inorg. Chem., 1991, vol. 30, page 1685, idem, 1988, vol. 27, page 3464, idem, 1994, vol. 33, page 545, Inorg. Chim. Acta, 1991, vol. 181, page 245, J. Organomet. Chem., 1987, vol. 335, page 293, and J. Am. Chem. Soc. 1985, vol. 107, page 1431.

Above all, the ortho-metallized metal complex in the invention is preferably a compound whose triplet exciton emits light from the viewpoint of improvement in luminous efficiency. When the phosphorescent light-emitting material is a porphyrin metal complex, it is preferably a porphyrin platinum complex.

The content of the host material(s) in the light-emitting layer is not particularly limited. However, the content is preferably 90 to 99.9 mass %, more preferably 95 to 99.9 mass %, and still more preferably 97 to 99.9 mass %.

The organic electroluminescent device of the invention can emit light of any color by containing the at least two light-emitting materials including the at least one phosphorescent light-emitting material. At least two light-emitting materials including at least one phosphorescent light-emitting material, particularly, three or more light-emitting materials, are preferably used in order to obtain a white light-emitting device having high luminous efficiency and high luminous brilliance. These light-emitting materials can be appropriately selected from the aforementioned examples.

For example, a white light-emitting device can be obtained by combining a blue light-emitting material and an orange light-emitting material which emit rays of complementary colors as the two light-emitting materials. Alternatively, a white light-emitting device can also be obtained by appropriately selecting three or more light-emitting materials including blue, green and red light-emitting materials.

The blue light-emitting material preferably has a maximal light emission wavelength (wavelength at the maximum luminescence intensity) of 400 to 500 nm, more preferably 420 to 490 nm, and still more preferably 430 to 470 nm.

The green light-emitting material preferably has a maximal light emission wavelength of 500 to 570 nm, more preferably 500 to 560 nm and still more preferably 500 to 550 nm.

The red light-emitting material preferably has a maximal light emission wavelength of 580 to 670 nm, more preferably 590 to 660 nm, and still more preferably 600 to 650 nm.

The organic electroluminescent device of the invention may have one or more light-emitting layers, as aforementioned.

When two light-emitting materials are used to produce a white light-emitting device in the invention, the two light-emitting materials and a host material need to be contained in the same light-emitting layer. When three light-emitting materials are used, the three light-emitting materials may be contained in the same light-emitting layer. Alternatively, two of the three light-emitting materials may be contained in the same light-emitting layer, and the other may be contained in a different light-emitting layer, and these light-emitting layers may be laminated.

The light-emitting device having either structure has layers which are less than those of a light-emitting device including at least two light-emitting materials contained in respective light-emitting layers, and can be simply produced.

Although the light-emitting layer in the invention needs to contain at least two light-emitting materials including at least one phosphorescent light-emitting material, the light-emitting layer can also contain at least one fluorescent light-emitting material. The type of the phosphorescent light-emitting material usable in the invention is not particularly limited, and the phosphorescent light-emitting material can be appropriately selected from known materials. Examples of the phosphorescent light-emitting material include, but are not limited to, those described in JP-A No. 2004-146067, paragraph No. 0027 and JP-A No. 2004-103577, paragraph No. 0057.

Preferably, the concentration of each of the light-emitting materials in the light-emitting layer is 5 mass % or less and the total concentration of the light-emitting materials in the light-emitting layer is 10 mass % or less in the invention. More preferably, the concentration of each of the light-emitting materials is 0.03 mass % to 3 mass % and the total concentration of the light-emitting materials is 5 mass % or less. Still more preferably, the concentration of each of the light-emitting materials is 0.1 mass % to 2 mass % and the total concentration of the light-emitting materials is 3 mass % or less.

When the light-emitting materials include at least one blue light-emitting material, the minimum excitation triplet energy (hereinafter, referred to as $T_1$) of the host material is preferably 60 kcal/mol (251.4 kJ/mol) to 90 kcal/mol (377.1 kJ/mol), more preferably 63 kcal/mol (264 kJ/mol) to 85 kcal/mol (356.2 kJ/mol), still more preferably 65 kcal/mol (272 kJ/mol) to 80 kcal/mol (335.2 kJ/mol), and most preferably 66 kcal/mol (276.5 kJ/mol) to 80 kcal/mol (335.2 kJ/mol).

When $T_1$ of the host material is smaller than $T_1$ of each of the light-emitting materials, excitons occurring in the light-emitting materials undesirably move to the host material. Although the blue light-emitting material has an emission peak in the shorter wavelength, and, therefore, has large $T_1$, the host material having $T_1$ within the above-described range can prevent the excitons from moving to the host material.

As for the elements of the organic electroluminescent device of the invention, such as the substrate, the electrodes, the organic layers and other layers, those described in, for example, JP-A No. 2004-221068, paragraph Nos. 0013 to 0082; JP-A No. 2004-214178, paragraph Nos. 0017 to 0091; JP-A No. 2004-146067, paragraph Nos. 0024 to 0035; JP-A No. 2004-103577, paragraph Nos. 0017 to 0068; JP-A No. 2003-323987, paragraph Nos. 0014 to 0062; JP-A No. 2002-305083, paragraph Nos. 0015 to 0077; JP-A No. 2001-172284, paragraph Nos. 0008 to 0028; JP-A No. 2000-186094, paragraph Nos. 0013 to 0075; and JP-A No. 2003-515897, paragraph Nos. 0016 to 0118 can be applied to the invention. However, the invention is not limited by these.

In the organic electroluminescent device of the invention, luminescence can be obtained by applying a direct current voltage (which may be used in combination with an alternate current voltage, if necessary) (usually 2 V to 15 V) or a direct current between the anode and the cathode.

One of the important characteristic values of the organic electroluminescent device is external quantum efficiency (luminous efficiency). The external quantum efficiency is calculated from the formula of external quantum efficiency $\phi$=the number of photons emitted from an element/the number of electrons injected into the element". The larger the value is, the more advantageous the organic electroluminescent device is in terms of power consumption.

The external quantum efficiency of the organic electroluminescent device can be obtained by measuring the luminous brilliance, the emission spectrum and the current density, and calculating it from the measured results and a luminosity curve. That is, the number of the electrons inputted can be calculated from the current density value. The luminous brilliance can be converted into the number of photons emitting light by integration calculation using the emission spectrum and the luminosity curve (spectrum). The external quantum efficiency (%) can be calculated from the formula of (number of photons emitting light/number of electrons inputted into element)×100.

In the invention, a direct current constant voltage is applied to the EL device with an apparatus, SOURCE MAJOR UNIT 2400 TYPE manufactured by Keithley Corporation, to cause the EL device to emit light, and the emission spectrum is measured with a spectrum radiation luminance meter, SR-3 manufactured by Topcon Corporation, and the CIE chromaticity coordinate (x, y) and the external quantum efficiency at 1000 cd/m$^2$ are obtained.

To drive the organic electroluminescent device of the invention, any of driving methods described in JP-A Nos. 2-148687, 6-301355, 5-29080, 7-134558, 8-234685 and 8-241047, Japanese Patent No. 2,784,615, and U.S. Pat. Nos. 5,828,429 and 6,023,308 can be used.

The organic electroluminescent device of the invention can be preferably used in the fields of display devices (for example, full color display devices), backlights, electronic photographs, light sources for illumination, light sources for recording (for example, light source arrays), light sources for exposure, light sources for reading, signs, signboards, interior decorations and optical communications.

EXAMPLES

Hereinafter, the invention is described while referring to examples. However, the invention is not limited to these examples.

Comparative Example 1

A transparent electrically conductive film made of indium tin oxide (ITO), formed on a glass substrate, having a thickness of 150 nm and manufactured by GEOMATEC Co., Ltd. was patterned by using photo lithography and hydrochloric acid etching to form an anode. The patterned ITO substrate was sequentially washed with acetone and ultrasonic waves, with pure water, and with isopropyl alcohol and ultrasonic waves. The substrate was then dried by nitrogen blow. Next, the substrate was washed with ultraviolet ray ozone, and was placed in a vacuum deposition device. Then, the internal air of the deposition device was exhausted.

Thereafter, 4,4'-bis[N-(1-Naphthyl)-N-phenylamino]biphenyl (α-NPD) having the following structure was heated in the deposition device, and was deposited on the anode at a vapor deposition speed of 0.2 nm/second to form a hole transport layer having a thickness of 40 nm.

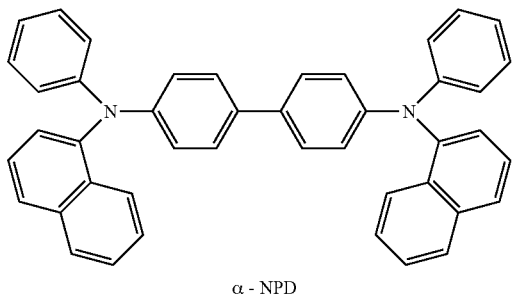

α - NPD

Next, 4,4'-N,N'-dicarbazol-biphenyl (CBP) serving as the host material to be contained in a light-emitting layer, Iridium(III)bis[(4,6-difluorophenyl)-pyridinate-N,C2]picolinate (Firpic) serving as a blue light-emitting material, tris(2-phenylpyridine)iridium (Ir(ppy)$_3$) serving as a green light-emitting material, and dopant A serving as a red light-emitting material were heated and simultaneously deposited on the hole transport layer to form a light-emitting layer. The vapor deposition speed of CBP was controlled to 0.2 nm/second. The light-emitting layer formed on the hole transport layer contained 1.5 mass % of Firpic, 0.5 mass % of Ir(ppy)$_3$, and 0.5 mass % of dopant A and had a thickness of 30 nm.

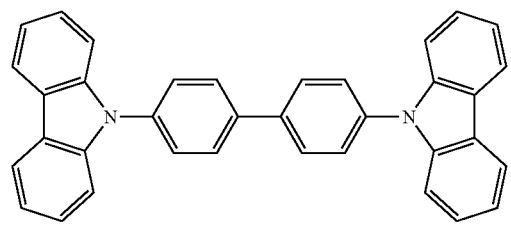

C B P

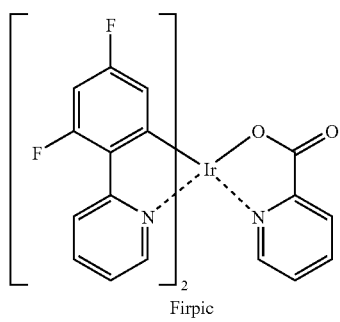

Firpic

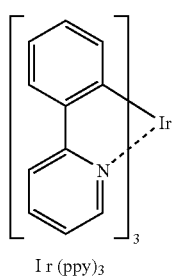

Ir(ppy)$_3$

-continued

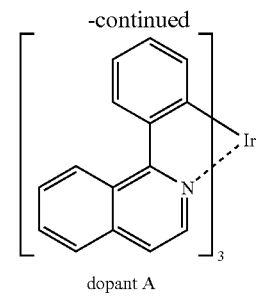

dopant A

Further, aluminum(III)bis(2-methyl-8-quinolinato)4-phenylphenolate (BAlq) represented by the following formula was deposited at a vapor deposition speed of 0.1 nm/second to form an electron transport layer having a thickness of 30 nm on the light-emitting layer.

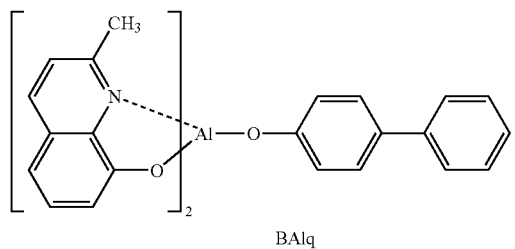

BAlq

Then, lithium fluoride (LiF) was deposited on the electron transport layer at a vapor deposition speed of 0.1 nm/second to form an electron-injecting layer having a thickness of 1 nm. Further, aluminum was deposited on the electron-injecting layer at a vapor deposition speed of 0.5 nm/second to form a cathode having a thickness of 150 nm.

Aluminum lead wires were electrically connected to the anode and the cathode, respectively.

In the above-described production method, the vapor deposition was monitored with a crystal oscillation-type film deposition controller to obtain films having a desired thickness.

The thus-obtained layered matter was put in a glove box whose internal air had been replaced with nitrogen gas without exposing the layered matter to air. A moisture absorbent (manufactured by SAES Getters) was stuck to a seal cover having a concave portion therein and made of stainless steel in the glove box. The layered matter was placed in the seal cover and the seal cover was sealed with an ultraviolet ray-curable adhesive (XNR5516HV manufactured by Nagase Chiba) serving as an adhesive.

An organic EL device of Comparative Example I was thus obtained.

Comparative Example 2

A transparent electrically conductive film made of ITO and deposited on a glass substrate was patterned, washed and placed in a vacuum deposition device in the same manner as the corresponding procedures in Comparative Example 1. Then, the internal air of the deposition device was exhausted.

Thereafter, copper phthalocyanine (CuPc) shown below was heated and deposited on the anode formed on the substrate at a vapor deposition speed of 0.1 nm/second in the deposition device to form a hole-injecting layer having a thickness of 10 nm.

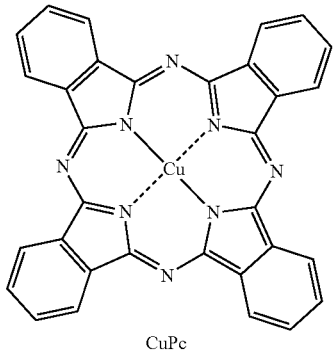

CuPc

Next, α-NPD was heated and deposited on the hole-injecting layer at a vapor deposition speed of 0.2 nm/second to form a hole transport layer having a thickness of 30 nm.

Then, CBP serving as the host material to be contained in a light-emitting layer, Firpic serving as a blue light-emitting material, Ir(ppy)$_3$ serving as a green light-emitting material, and dopant A serving as a red light-emitting material were heated and simultaneously deposited on the hole transport layer to form a light-emitting layer. The vapor deposition speed of CBP was controlled to 0.2 nm/second. The light-emitting layer formed on the hole transport layer contained 1.5 mass % of Firpic, 0.5 mass % of Ir(ppy)$_3$, and 0.5 mass % of dopant A and had a thickness of 30 nm.

Further, BAlq was deposited on the light-emitting layer at a vapor deposition speed of 0.1 nm/second to form a hole block layer having a thickness of 10 nm.

Next, tris(8-hydroxyquinolinato)aluminum(III) (Alq) shown below was deposited on the hole block layer at a vapor deposition speed of 0.2 nm/second to form an electron transport layer having a thickness of 35 nm.

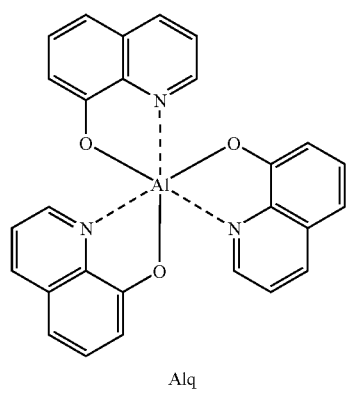

Alq

Then, lithium fluoride (LiF) was deposited on the electron transport layer at a vapor deposition speed of 0.1 nm/second to form an electron-injecting layer having a thickness of 1 nm. Further, aluminum was deposited on the electron-injecting layer at a vapor deposition speed of 0.5 nm/second to form a cathode having a thickness of 150 nm.

In the above-described production method, the vapor deposition was monitored with a crystal oscillation-type film deposition controller to obtain films having a desired thickness.

Aluminum lead wires were electrically connected to the anode and the cathode, respectively.

The thus-obtained layered matter was put in a glove box whose internal air had been replaced with nitrogen gas without exposing the layered matter to air. A moisture absorbent (manufactured by SAES Getters) was stuck to a seal cover having a concave portion therein and made of stainless steel in the glove box. The layered matter was placed in the seal cover and the seal cover was sealed with an ultraviolet ray-curable adhesive (XNR5516HV manufactured by Nagase Chiba) serving as an adhesive.

An organic EL device of Comparative Example 2 was thus obtained.

Comparative Example 3

An organic EL device of Comparative Example 3 was produced in the same manner as in Comparative Example 2, except that the host material to be contained in the light-emitting layer was changed from CBP to 4,4'-N,N'-carbazole-biphenyl (mCP) shown below.

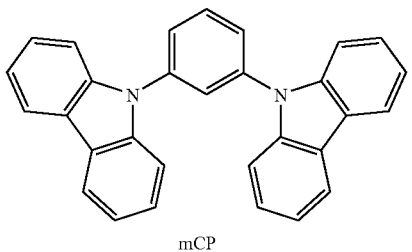

mCP

Example 1

A transparent electrically conductive film made of ITO and deposited on a glass substrate was patterned, washed and placed in a vacuum deposition device in the same manner as the corresponding procedures in Comparative Example 1. Then, the internal air of the deposition device was exhausted.

Thereafter, CuPc was heated and deposited on the anode formed on the substrate at a vapor deposition speed of 0.1 nm/second in the deposition device to form a first hole transport layer having a thickness of 10 nm.

Next, α-NPD was heated and deposited on the first hole transport layer at a vapor deposition speed of 0.2 nm/second to form a second hole transport layer having a thickness of 30 nm.

Then, 4,4',4"-tris (N-carbazolyl)-triphenylamine (TCTA) shown below was heated and deposited on the second hole transport layer at a vapor deposition speed of 0.2 nm/second to form a third hole transport layer having a thickness of 10 nm.

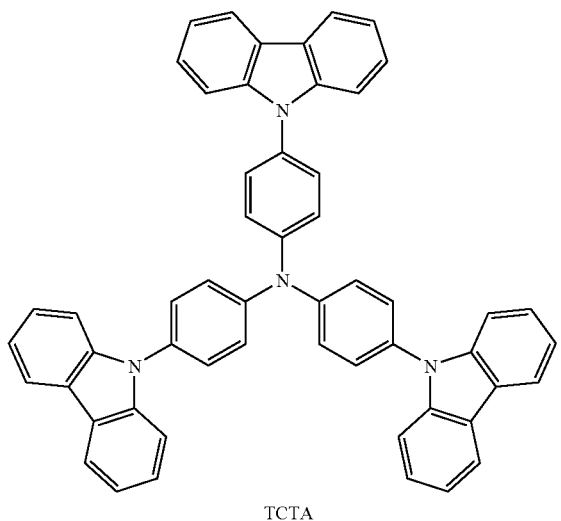

TCTA

Then, mCP serving as the host material to be contained in a light-emitting layer, Firpic serving as a blue light-emitting material, Ir(ppy)$_3$ serving as a green light-emitting material, and dopant A serving as a red light-emitting material were heated and simultaneously deposited on the third hole transport layer to form a light-emitting layer. The vapor deposition speed of mCP was controlled to 0.2 nm/second. The light-emitting layer formed on the third hole transport layer contained 1.5 mass % of Firpic, 0.5 mass % of Ir(ppy)$_3$, and 0.5 mass % of dopant A and had a thickness of 30 nm.

Further, ETM-1 shown below was deposited on the light-emitting layer at a vapor deposition speed of 0.1 nm/second to form a first electron transport layer having a thickness of 10 nm.

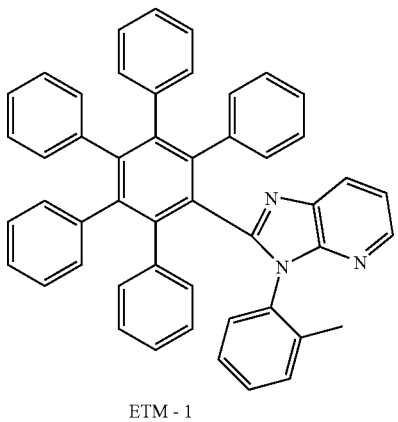

ETM-1

Further, BAlq was deposited on the first electron transport layer at a vapor deposition speed of 0.1 nm/second to form a second electron transport layer having a thickness of 10 nm.

Next, Alq was deposited on the second electron transport layer at a vapor deposition speed of 0.2 nm/second to form a third electron transport layer having a thickness of 25 nm.

Then, lithium fluoride (LiF) was deposited on the third electron transport layer at a vapor deposition speed of 0.1 nm/second to form an electron-injecting layer having a thickness of 1 nm. Further, aluminum was deposited on the electron-injecting layer at a vapor deposition speed of 0.5 nm/second to form a cathode having a thickness of 150 nm.

In the above-described production method, the vapor deposition was monitored with a crystal oscillation-type film deposition controller to obtain films having a desired thickness.

Aluminum lead wires were electrically connected to the anode and the cathode, respectively.

The thus-obtained layered matter was put in a glove box whose internal air had been replaced with nitrogen gas without exposing the layered matter to air. A moisture absorbent (manufactured by SAES Getters) was stuck to a seal cover having a concave portion therein and made of stainless steel in the glove box. The layered matter was placed in the seal cover and the seal cover was sealed with an ultraviolet ray-curable adhesive (XNR5516HV manufactured by Nagase Chiba) serving as an adhesive.

An organic EL device of Example 1 was thus obtained.

[Evaluation of Material Property]

(1) Ionization Potential

Each of all the compounds used to form the organic compound layers of the devices of Example 1 and Comparative Examples 1 to 3 but ETM-1 was deposited on a glass substrate to form a film having a thickness of 50 nm. The ionization potential of the film was measured at ordinary temperature at ordinary pressure with an ultraviolet ray photoelectron analyzer AC-1 manufactured by Riken Keiki Co., Ltd. The ionization potential of ETM-1 was measured by depositing ETM-1 on a gold substrate to form a film having a thickness of 50 nm and measuring the ionization potential of the film with a measuring device, MUL-010HI manufactured by PHI.

(2) Electron Affinity

The ultraviolet and visible ray absorption spectrum of the film used for the measurement of ionization potential was measured with a UV3100-type spectrophotometer manufactured by Shimadzu Corporation, and the excitation energy was determined from the energy at the long wavelength end of the absorption spectrum. The electron affinity was calculated from the values of the excitation energy and the ionization potential.

The following Table 1 shows these results.

TABLE 1

| Compound Name | Ionization Potential [eV] | Electron Affinity [eV] |
|---|---|---|
| CuPc | 5.1 | 3.4 |
| NPD | 5.4 | 2.4 |
| TCTA | 5.7 | 2.3 |
| CBP | 6.1 | 2.7 |
| mCP | 5.9 | 2.3 |
| ETM-1 | 6.5 | 2.6 |
| BAlq | 5.9 | 2.9 |
| Alq | 5.8 | 3.0 |

The summary of the ionization potential and the electron affinity of each of the layers of the devices of Comparative Examples 1 to 3 and Example 1 obtained from these measured values is shown in the following Tables.

TABLE 2

|  |  | NPD | CBP (Light-Emitting Layer) | BAlq |
|---|---|---|---|---|
| Comparative | Ip | 5.4 | 6.1 | 5.9 |
| Example 1 | Ea | 2.4 | 2.7 | 2.9 |

Ionization potential is abbreviated to Ip, and electron affinity is abbreviated to Ea.

TABLE 3

| | | CuPc | NPD | CBP (Light-Emitting Layer) | BAlq | Alq |
|---|---|---|---|---|---|---|
| Comparative Example 2 | Ip | 5.1 | 5.4 | 6.1 | 5.9 | 5.8 |
| | Ea | 3.4 | 2.4 | 2.7 | 2.9 | 3.0 |

TABLE 4

| | | CuPc | NPD | mCP (Light-Emitting Layer) | BAlq | Alq |
|---|---|---|---|---|---|---|
| Comparative Example 3 | IP | 5.1 | 5.4 | 5.9 | 5.9 | 5.8 |
| | Ea | 3.4 | 2.4 | 2.3 | 2.9 | 3.0 |

TABLE 5

| | | CuPc | NPD | TCTA | mCP (Light-Emitting Layer) | ETM-1 | BAlq | Alq |
|---|---|---|---|---|---|---|---|---|
| Example 1 | IP | 5.1 | 5.4 | 5.7 | 5.9 | 6.5 | 5.9 | 5.8 |
| | Ea | 3.4 | 2.4 | 2.3 | 2.3 | 2.6 | 2.9 | 3.0 |

[Evaluation of Organic Electroluminescent Device]

A direct current voltage was applied to each of the devices of Comparative Examples 1 to 3 and Example 1 with SOURCE MAJOR UNIT 2400 type manufactured by KEITHLEY so as to cause each organic EL device to emit light. The external quantum efficiency ($\eta_{1000}$) (%) at 1000 cd/m$^2$ was obtained. Also, the emission spectrum of each device was measured with SR-3 manufactured by Topcon Corporation, and CIE1964 chromaticity coordinate (x, y) was obtained. The closer to the CIE chromaticity coordinate (0.33, 0.33) of an ideal white light source the value of the CIE chromaticity coordinate is, the better the value is. Table 6 shows these values.

TABLE 6

| | η [%] | Chromaticity Coordinate |
|---|---|---|
| Comparative Example 1 | 2.1 | (0.47, 0.40) |
| Comparative Example 2 | 3.5 | (0.45, 0.40) |
| Comparative Example 3 | 3.9 | (0.41, 0.38) |
| Example 1 | 6.7 | (0.32, 0.31) |

The comparison of the results of Comparative Examples 1 and 2 shows that the external quantum efficiency is improved by increasing the number of the layers of a device. The comparison of the results of Comparative Examples 2 and 3 shows that both the luminous efficiency is insufficient and the chromaticity is inadequate even in the device of Comparative Example 3 containing the host material having high $T_1$ (Here, $T_1$ of CBP used in Comparative Example 2 is 60 kcal/mol, and that of mCP used in Comparative Example 3 is 67 kcal/mol) so as to prevent the excitons from moving from the blue material to the host material but having only two layers between the light-emitting layer and the cathode, and only two layers between the light-emitting layer and the anode.

On the other hand, Table 6 obviously shows that the device of Example 1 having three electron transport layers and three hole transport layers has good luminous efficiency and chromaticity.

Devices, which were produced in the same manner as in Example 1 except that TCTA was replaced with the following HTM-1 and except that ETM-1 was replaced with each of the following ETM-2 and ETM-3, could provide effects similar to those of Example 1. The ionization potential and the electron affinity of each of these materials are shown in Table 7.

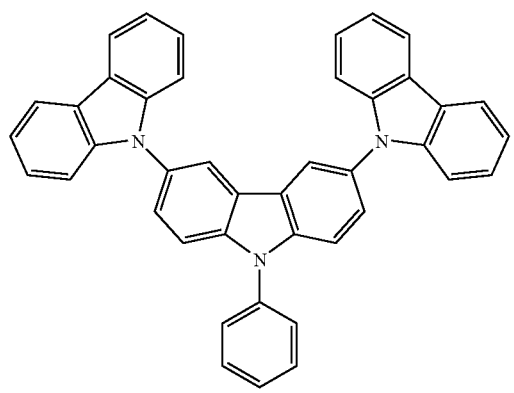

HTM-1

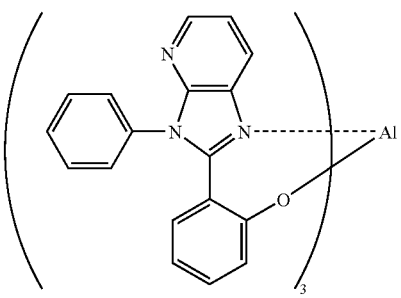

ETM-2

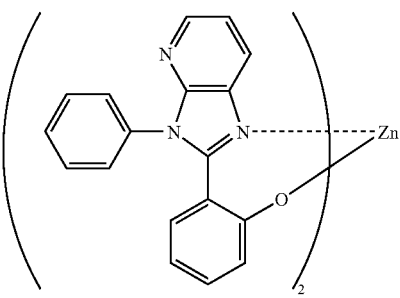

ETM-3

TABLE 7

| Compound Name | Ionization Potential [eV] | Electron Affinity [eV] |
|---|---|---|
| HTM-1 | 5.8 | 2.5 |
| ETM-2 | 5.8 | 2.7 |
| ETM-3 | 5.8 | 2.8 |

The reason for this is thought to be as follows. The difference between the ionization potentials of adjacent layers among the layers from the organic layer the nearest to the anode to the light-emitting layer can be small, and the difference between the electron affinities of adjacent layers among the layers from the organic layer the nearest to the cathode to the light-emitting layer can be small.

As described above, the light-emitting device having the configuration recited in the invention has high luminous efficiency and excellent chromaticity.

What is claimed is:

1. An organic electroluminescent device having an anode, a cathode, and a plurality of organic compound layers provided between the anode and the cathode and including a light-emitting layer, and three or more organic compound layers provided between the light-emitting layer and the anode, or between the light-emitting layer and the cathode;

wherein the light-emitting layer contains a host material and at least two light-emitting materials, and wherein the at least two light-emitting materials include a phosphorescent light-emitting material, and wherein three or more organic compound layers are provided between the light-emitting layer and the anode, the formula (1): $Ip1>Ip2>Ip3> \ldots >Ipn$ is satisfied, wherein $Ip1$ is the ionization potential of the light-emitting layer, and the ionization potentials of the three or more organic compound layers are $Ip2, Ip3, \ldots,$ and $Ipn$ in the order starting from the light-emitting layer, wherein n is an integer of 4 or more, or wherein three or more organic compound layers are provided between the light-emitting layer and the cathode, the formula (2): $Ea1<Ea2<Ea3< \ldots <Eam$ is satisfied, wherein $Ea1$ is the electron affinity of the light-emitting layer, and the electron affinities of the three or more organic compound layers are $Ea2, Ea3, \ldots,$ and $Eam$ in the order starting from the light-emitting layer, wherein m is an integer of 4 or more.

2. The organic electroluminescent device of claim 1, wherein the two light-emitting materials emit light when a voltage is applied between the anode and the cathode.

3. The organic electroluminescent device of claim 2, wherein the two light-emitting materials contain a blue light-emitting material.

4. The organic electroluminescent device of claim 3, wherein the blue light-emitting material is the phosphorescent light-emitting material.

5. The organic electroluminescent device of claim 2, wherein the organic electroluminescent device emits white light.

6. The organic electroluminescent device of claim 2, wherein the concentration of each of the two light-emitting materials in the light-emitting layer is 2 mass % or less, and the total concentration of the two light-emitting materials in the light-emitting layer is 3 mass % or less.

7. The organic electroluminescent device of claim 1, wherein the two light-emitting materials contain a blue light-emitting material.

8. The organic electroluminescent device of claim 7, wherein the blue light-emitting material is the phosphorescent light-emitting material.

9. The organic electroluminescent device of claim 1, wherein the organic electroluminescent device emits white light.

10. The organic electroluminescent device of claim 1, wherein the concentration of each of the two light-emitting materials in the light-emitting layer is 2 mass % or less, and the total concentration of the two light-emitting materials in the light-emitting layer is 3 mass % or less.

11. The organic electroluminescent device of claim 1, wherein a height of a barrier between adjacent layers is 0.5 eV or less.

12. The organic electroluminescent device of claim 1, wherein the ionization potential, $Ip2$, of the organic compound layer adjacent to the anode side surface of the light-emitting layer is 6.0 to 5.5 eV.

13. An organic electroluminescent device having an anode, a cathode, and a plurality of organic compound layers provided between the anode and the cathode and including a light-emitting layer, wherein the light-emitting layer contains a host material and two light-emitting materials, and wherein the two light-emitting materials include a phosphorescent light-emitting material; and wherein three or more organic compound layers are provided between the light-emitting layer and the anode; and wherein three or more organic compound layers are provided between the light-emitting layer and the cathode, and wherein the ionization potential of the light-emitting layer is $Ip1$ and the ionization potentials of the three or more organic compound layers provided between the light-emitting layer and the anode are $Ip2, Ip3, \ldots,$ and $Ipn$ in the order starting from the light-emitting layer, and wherein the formula (1): $Ip1>Ip2>Ip3> \ldots > Ipn$, wherein n is an integer of 4 or more, is satisfied, and wherein the electron affinity of the light-emitting layer is $Ea1$ and the electron affinities of the three or more organic compound layers provided between the light-emitting layer and the cathode are $Ea2, Ea3, \ldots,$ and $Eam$ in the order starting from the light-emitting layer, and wherein the formula (2): $Ea1<Ea2<Ea3< \ldots <Eam$, wherein m is an integer of 4 or more, is satisfied.

14. The organic electroluminescent device of claim 13, wherein the two light-emitting materials emit light when a voltage is applied between the anode and the cathode.

15. The organic electroluminescent device of claim 14, wherein the two light-emitting materials contain a blue light-emitting material.

16. The organic electroluminescent device of claim 15, wherein the blue light-emitting material is the phosphorescent light-emitting material.

17. The organic electroluminescent device of claim 14, wherein the organic electroluminescent device emits white light.

18. The organic electroluminescent device of claim 14, wherein the concentration of each of the two light-emitting materials in the light-emitting layer is 2 mass % or less, and the total concentration of the two light-emitting materials in the light-emitting layer is 3 mass % or less.

19. The organic electroluminescent device of claim 13, wherein the two light-emitting materials contain a blue light-emitting material.

20. The organic electroluminescent device of claim 19, wherein the blue light-emitting material is the phosphorescent light-emitting material.

21. The organic electroluminescent device of claim 13, wherein the organic electroluminescent device emits white light.

22. The organic electroluminescent device of claim 13, wherein the concentration of each of the two light-emitting materials in the light-emitting layer is 2 mass % or less, and the total concentration of the two light-emitting materials in the light-emitting layer is 3 mass % or less.

* * * * *